US007485581B2

(12) United States Patent
Sadjadi et al.

(10) Patent No.: US 7,485,581 B2
(45) Date of Patent: Feb. 3, 2009

(54) DEVICE WITH GAPS FOR CAPACITANCE REDUCTION

(75) Inventors: S. M. Reza Sadjadi, Saratoga, CA (US); Zhi-Song Huang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 464 days.

(21) Appl. No.: 11/291,411

(22) Filed: Nov. 30, 2005

(65) Prior Publication Data

US 2007/0123016 A1 May 31, 2007

(51) Int. Cl.
*H01L 21/302* (2006.01)
*H01L 21/461* (2006.01)
*H01L 21/3205* (2006.01)
*H01L 21/4763* (2006.01)

(52) U.S. Cl. ....................... 438/736; 438/597; 438/738; 438/711

(58) Field of Classification Search ................. 438/736, 438/597, 421, 261, 738, 711, 714, 638
See application file for complete search history.

(56) References Cited

U.S. PATENT DOCUMENTS 5,510,645 A 4/1996 Fitch et al.
6,232,214 B1 5/2001 Lee et al.
6,297,125 B1 10/2001 Nag et al.
6,605,541 B1 8/2003 Yu
6,780,753 B2 8/2004 Latchford et al.
6,781,192 B2 8/2004 Farrar
6,806,177 B2 * 10/2004 Strane et al. ................ 438/597
6,846,741 B2 1/2005 Cooney, III et al.
6,858,153 B2 2/2005 Bjorkman et al.
6,911,397 B2 6/2005 Jun et al.
7,008,878 B2 3/2006 Hsu et al.
2003/0219988 A1 11/2003 Shan et al.
2003/0232474 A1 12/2003 Lai et al.
2003/0232509 A1 12/2003 Chung et al.
2004/0002217 A1 1/2004 Mazur et al.
2004/0072430 A1 4/2004 Huang et al.
2004/0126705 A1 7/2004 Lu et al.
2005/0110145 A1 5/2005 Elers
2006/0121721 A1 * 6/2006 Lee et al. .................... 438/618
2006/0160353 A1 7/2006 Gueneau de Mussy et al.
2007/0049017 A1 * 3/2007 Hsieh ......................... 438/672
2007/0122977 A1 5/2007 Kim et al.
2007/0123016 A1 * 5/2007 Sadjadi et al. .............. 438/597
2007/0123017 A1 * 5/2007 Sadjadi et al. .............. 438/597

(Continued)

OTHER PUBLICATIONS

U.S. Appl. No. 11/291,303, entitled "Self-Aligned Pitch Reduction", by inventors: Kim et al., filed Nov. 30, 2005.

(Continued)

*Primary Examiner*—Walter L Lindsay, Jr.
(74) *Attorney, Agent, or Firm*—Beyer Law Group LLP

(57) ABSTRACT

A method for reducing capacitances between semiconductor devices is provided. A plurality of contact structures is formed in a dielectric layer. A mask is formed to cover the contact structures wherein the mask has mask features for exposing parts of the dielectric layer wherein the mask features have widths. The widths of the mask features are shrunk with a sidewall deposition. Gaps are etched into the dielectric layer through the sidewall deposition. The gaps are closed to form pockets in the gaps.

20 Claims, 13 Drawing Sheets

U.S. PATENT DOCUMENTS

2007/0123053 A1 5/2007 Kim et al.

OTHER PUBLICATIONS

U.S. Appl. No. 11/291,672, entitled "Device with Self Aligned Gaps for Capacitance Reduction", by inventors: Sadjadi et al., filed Nov. 30, 2005.

Office Action dated Dec. 17, 2007 for related U.S. Appl. No. 11/291,672.

Notice of Allowance dated Feb. 19, 2008 for related U.S. Appl. No. 11/558,238.

International Search Report dated Mar. 20, 2007 from corresponding International Application No. PCT/US2006/044719.

Written Opinion dated Mar. 20, 2007 from corresponding International Application No. PCT/US2006/044719.

International Search Report dated Mar. 27, 2007 from related International Application No. PCT/US2006/044521.

Written Opinion dated Mar. 27, 2007 from related International Application No. PCT/US2006/044521.

International Search Report dated Apr. 24, 2007 from related International Application No. PCT/US2006/044708.

Written Opinion dated Apr. 24, 2007 from related International Application No. PCT/US2006/044708.

* cited by examiner

DEVICE WITH GAPS FOR CAPACITANCE REDUCTION

BACKGROUND OF THE INVENTION

The present invention relates to the formation of semiconductor devices. More particularly, the invention relates to the formation of semiconductor devices with gaps for reducing capacitance.

In semiconductor-based device (e.g., integrated circuits or flat panel displays) manufacturing, dual damascene structures may be used in conjunction with copper conductor material to reduce the RC delays associated with signal propagation in aluminum based materials used in previous generation technologies. In dual damascene, instead of etching the conductor material, vias, and trenches may be etched into the dielectric material and filled with copper. The excess copper may be removed by chemical mechanical polishing (CMP) leaving copper lines connected by vias for signal transmission. To reduce the RC delays even further, porous and non-porous low-k dielectric constant materials may be used. In the specification and claims low-k is defined as k<3.0.

U.S. Pat. No. 6,297,125 discloses the use of air gaps to reduce capacitance.

SUMMARY OF THE INVENTION

To achieve the foregoing and in accordance with the purpose of the present invention a method for reducing capacitances between semiconductor devices is provided. A plurality of contact structures is formed in a dielectric layer. A mask is formed to cover the contact structures wherein the mask has mask features for exposing parts of the dielectric layer wherein the mask features have widths. The widths of the mask features are shrunk with a sidewall deposition. Gaps are etched into the dielectric layer through the sidewall deposition. The gaps are closed to form pockets in the gaps.

In another manifestation of the invention a method for reducing capacitances between semiconductor devices is provided. A plurality of contact structures is formed in a dielectric layer. A mask is formed to cover the contact structures wherein the mask has mask features for exposing parts of the dielectric layer wherein the mask features have widths. The widths of the mask features are shrunk with a sidewall deposition, wherein the shrinking the widths of the mask features shrinks the widths of the mask features by 5-80%, wherein the shrinking the widths of the mask features comprises at least one shrink cycle, wherein each shrink cycle comprises a shrink deposition phase, which forms deposits on sidewalls of the mask features to shrink the mask features and a shrink profile shaping phase, which shapes the deposition on the sidewalls of the mask features, wherein the profile shaping phase shapes the deposition on the sidewalls of the mask features to form vertical sidewalls. Gaps are etched into the dielectric layer through the sidewall deposition. The gaps are closed to form pockets in the gaps, wherein the closing the gaps comprises a plurality of cycles, wherein each cycle comprises a bread loaf deposition phase and a bread loaf profile shaping phase.

In another manifestation of the invention an apparatus for reducing capacitances between semiconductor devices is provided. A plasma processing chamber comprises a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source in fluid connection with the gas inlet, comprising a shrink deposition gas source, and a shrink profile shaping gas source is provided. A controller is controllably connected to the gas source and the at least one electrode and comprises at least one processor and computer readable media. The computer readable media comprises computer readable code for shrinking widths of mask features with sidewall deposition, comprising a plurality of cycles. Each cycle comprises computer readable code for providing a shrink deposition gas from the shrink deposition gas source, computer readable code for generating a plasma from the shrink deposition gas, computer readable code for stopping the shrink deposition gas from the shrink deposition gas source, computer readable code for providing a shrink profile shaping gas from the shrink profile shaping gas source which different from the deposition gas, computer readable code for generating a plasma from the shrink profile shaping gas, and computer readable code for stopping the shrink profile shaping gas from the shrink profile shaping gas source. The computer readable media further comprises computer readable code for etching gaps into the etch layer between contact structures through the sidewall deposition and computer readable code for closing the gaps to form pockets in the gaps.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
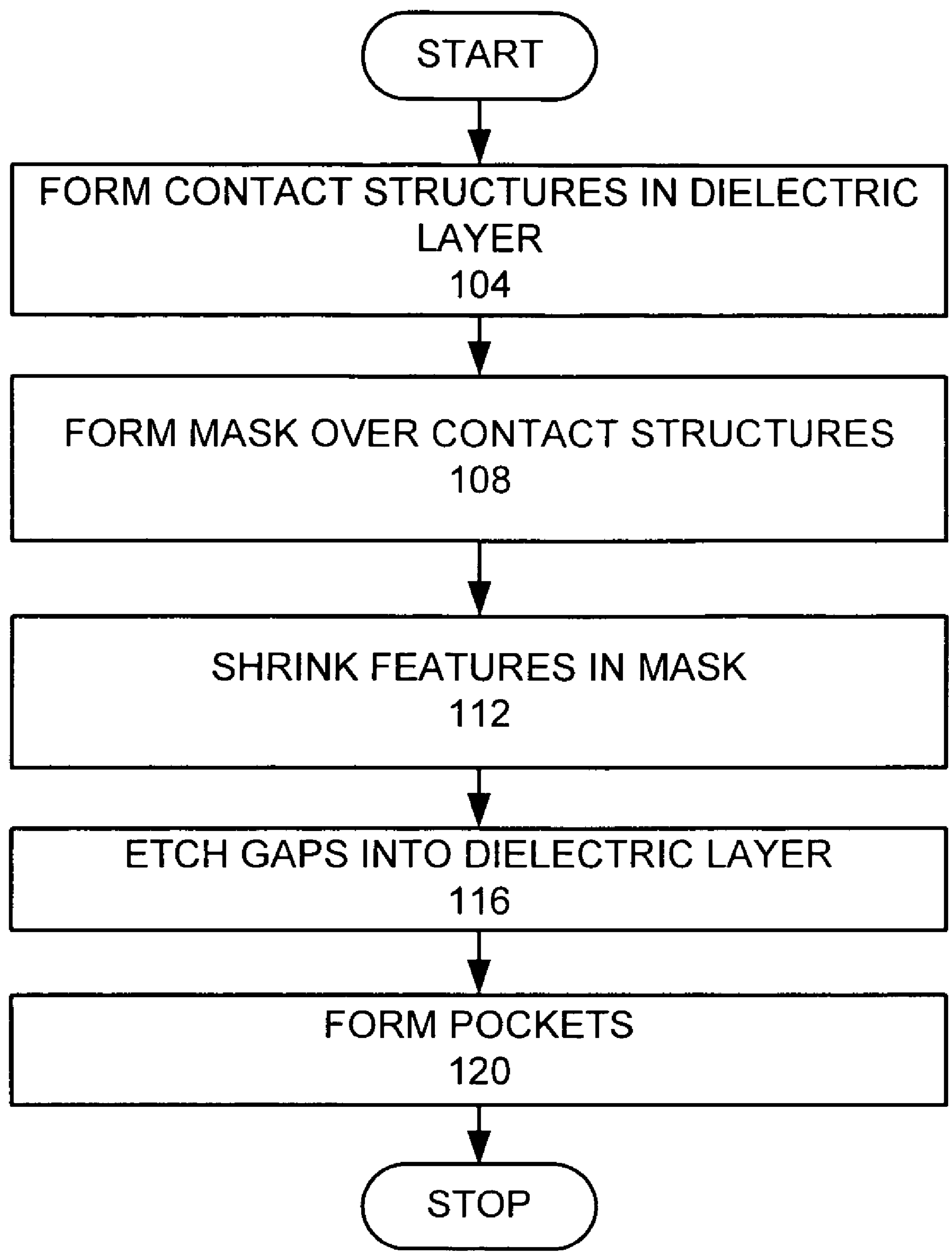
FIG. 1 is a high level flow chart of a process that may be used in an embodiment of the invention.

To facilitate understanding, FIG. 1 is a high level flow chart of a process that may be used in an embodiment of the invention. Contact structures are formed in a dielectric layer (step 104). A mask is formed over the contact structures (step 108). The mask has mask apertures (mask features) for forming gaps. The mask features are shrunk (step 112). Gaps are etched into the dielectric layer (step 112). Pockets are formed in the gaps (step 120). Preferably, each pocket has a volume with is at least half the size of the volume of each gap. The pockets may be filled with various fluids such as liquids or gases, such as air. More preferably, the pockets are gas pockets filled with a gas to form gas pockets.

EXAMPLE 1

Figure 2A:
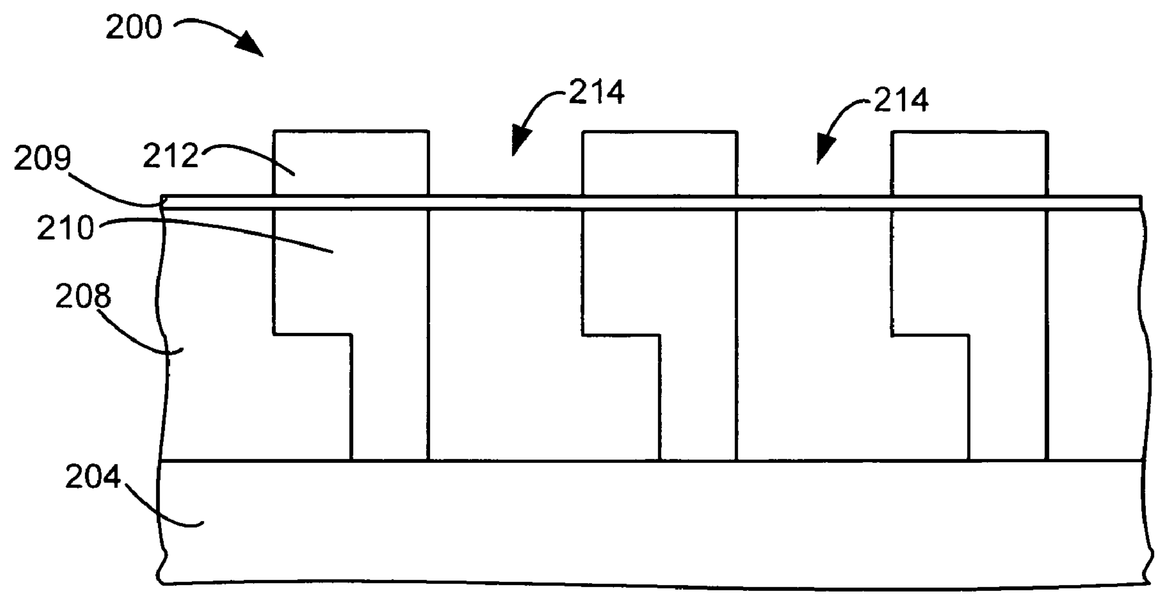
FIGS. 2A-E are schematic cross-sectional and top views of a stack processed according to an embodiment of the invention.

In an example of an embodiment of the invention, contact structures are formed in a dielectric layer of organosilicate glass (OSG) (step 104). FIG. 2A is a cross-sectional view of a stack 200 formed by this example. In this example, the OSG dielectric layer 208 is over a substrate 204, which may be a wafer or an interlayer dielectric. The contact structures 210 are dual damascene structures, which in this example are vias and trenches filed with copper. In this example, vias partially overlap trenches. Such structures may be made by first etching a via and then providing a trench mask that is misaligned. In this example, a barrier layer 209 is formed over the OSG dielectric layer 208 and contact structure 210. In this example, the barrier layer 209 is silicon nitride or silicon carbide.

A mask 212 is formed over the parts of the barrier layer 209 over the contact structures 210 (step 108). In this example, the mask 212 is a photoresist mask with photoresist features (apertures) 214. The photoresist mask features 214 are shrunk (step 112). To shrink the photoresist mask features 214, the substrate 204 is placed into a processing chamber.

Figure 4:
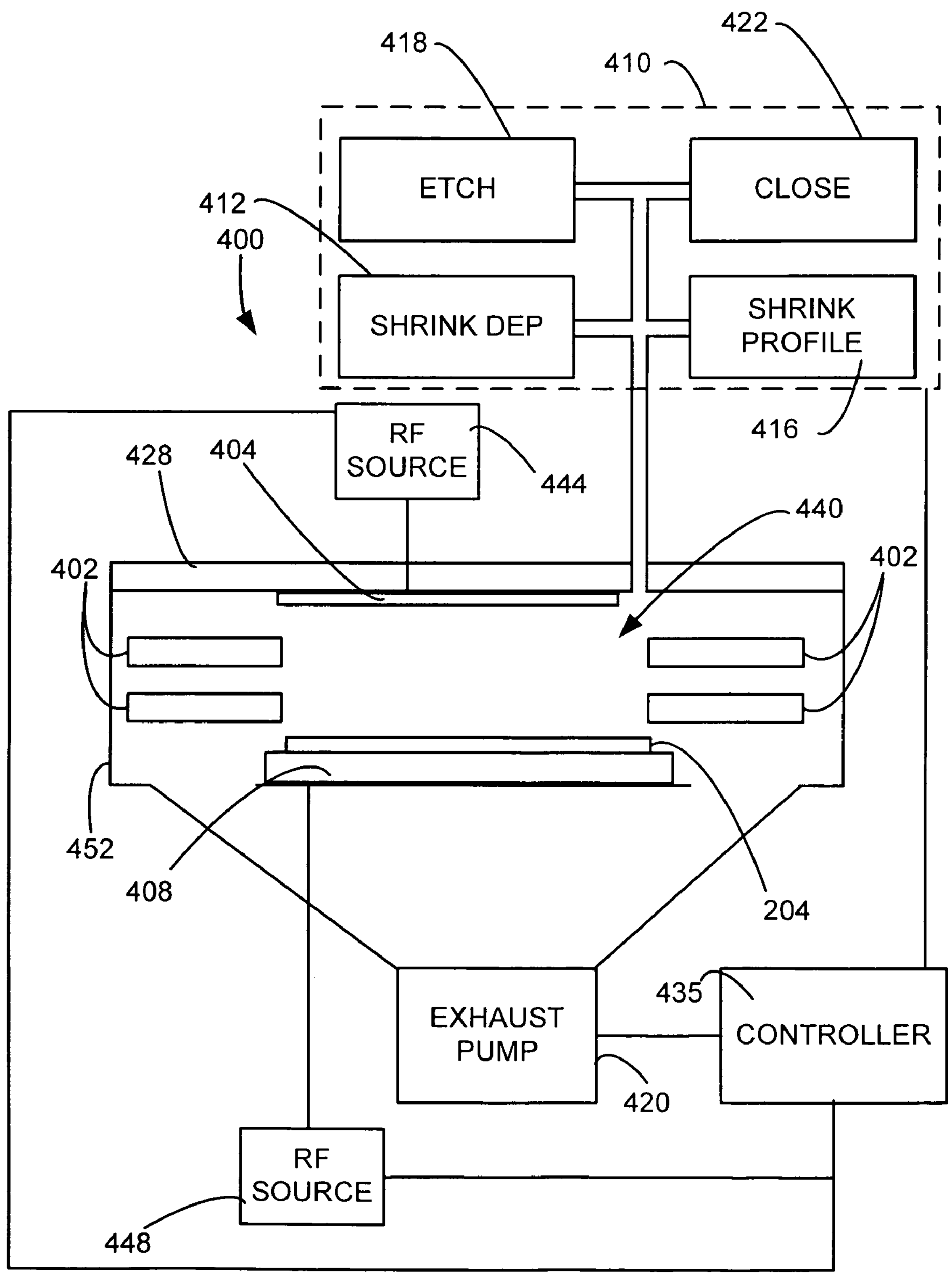
FIG. 4 is a schematic view of a plasma processing chamber that may be used in practicing the invention.

FIG. 4 is a schematic view of a processing chamber 400 that may be used to etch the gaps and form the bread loaf closures. The plasma processing chamber 400 comprises confinement rings 402, an upper electrode 404, a lower electrode 408, a gas source 410, and an exhaust pump 420. The gas source 410 comprises a shrink deposition gas source 412 and a shrink profile gas source 416. The gas source may comprise additional gas sources such as an etch gas source 418 and a gap closure gas source 422. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Lam Research Corporation's Dual Frequency Capacitive (DFC) System, made by LAM Research Corporation™ of Fremont, Calif., which may be used in a preferred embodiment of the invention, both the 27 MHz and 2 MHz power sources make up the second RF power source 448 connected to the lower electrode, and the upper electrode is grounded. In other embodiments, the RF power source may have a frequency up to 300 MHz. A controller 435 is controllably connected to the RF sources 444, 448, exhaust pump 420, and the gas source 410. The DFC System would be used when the layer to be etched 208 is a dielectric layer, such as silicon oxide or organo silicate glass.

Figure 5A:
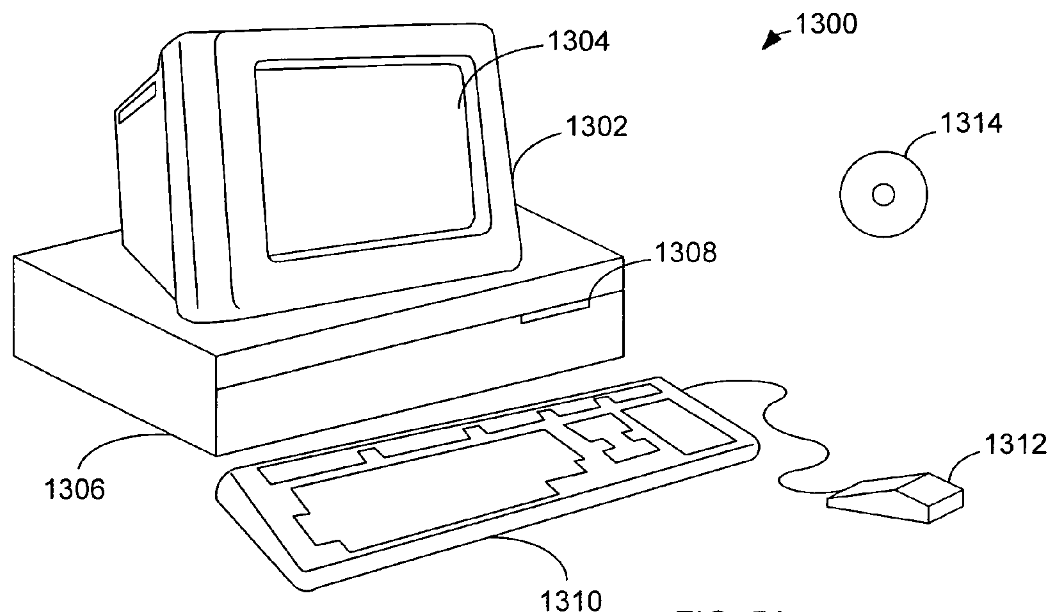
FIGS. 5A-B illustrate a computer system, which is suitable for implementing a controller used in embodiments of the present invention.
Figure 5B:
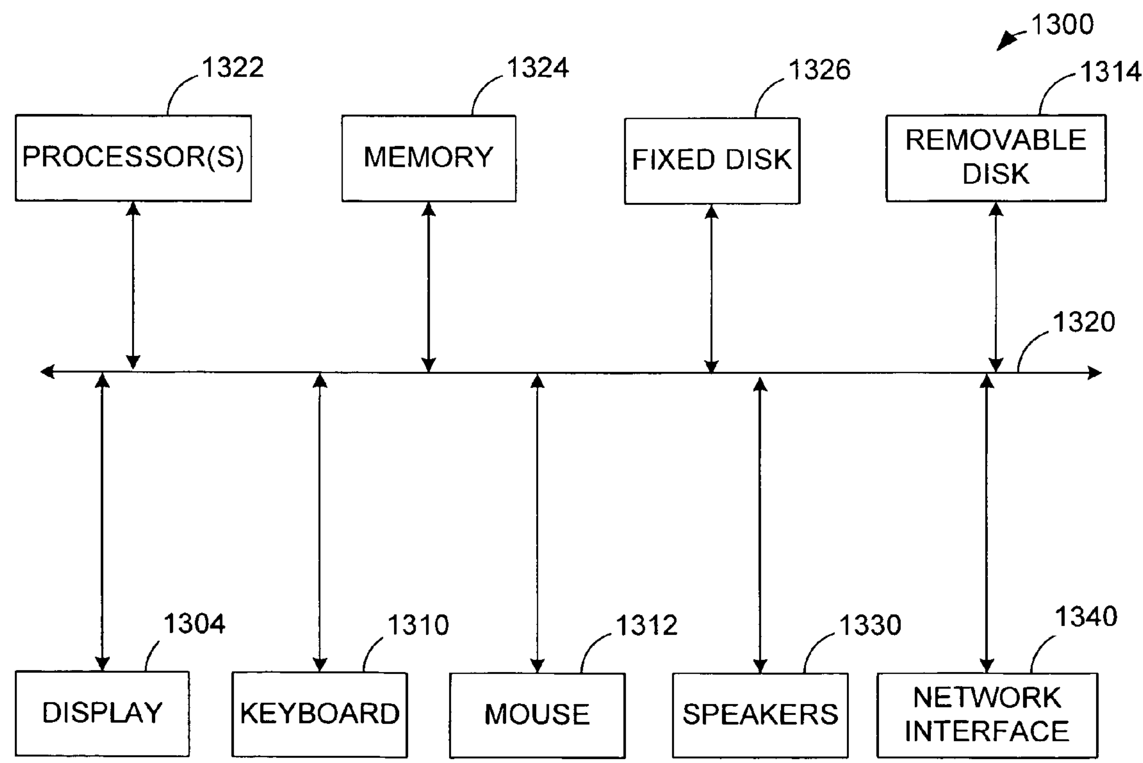

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3:
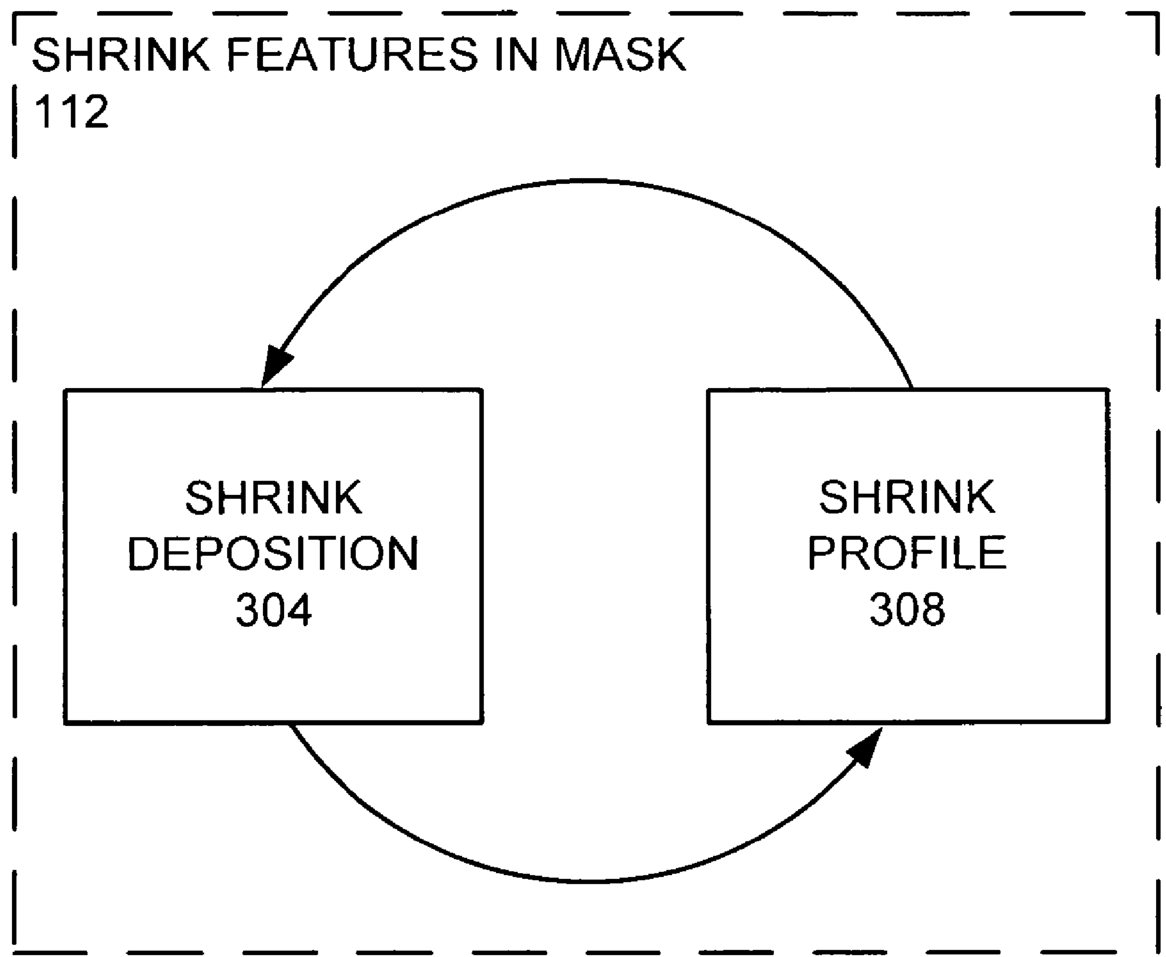
FIG. 3 is a more detailed flow of a step of shrinking features in a mask.

FIG. 3 is a more detailed flow chart of the step of shrinking the mask features 214 (step 112). As shown in FIG. 3, the shrinking the mask features comprises a plurality of cycles of a cyclic process comprising a shrink deposition phase (step 304) and profile shaping phase (step 308). An example of a shrink deposition phase (step 304) provides a flow of 150 sccm $CH_3F$, 75 sccm $N_2$, and 100 sccm Ar. The pressure is set to 80 mTorr. The substrate is maintained at a temperature of 20° C. The second RF source 448 provides 400 Watts at a frequency of 27 MHz and 0 Watts a frequency of 2 MHz. During the deposition phase the deposition gas is provided, the deposition gas is transformed into a plasma, and then the deposition gas is stopped.

An example of the shrink profile shaping phase (step 308) provides a halogen (i.e. fluorine, bromine, chlorine) containing gas, such as 100 sccm $CF_4$. In this example, $CF_4$ is the only gas provided during the profile shaping. A pressure of 20 mTorr is provided to the chamber. The second RF source 448 provides 600 Watts at a frequency of 27 MHz and 0 Watts a frequency of 2 MHz. During the profile shaping phase the profile shaping gas is provided, the profile shaping gas is transformed into a plasma, and then the profile shaping gas is stopped.

When there is a possibility that copper may be exposed due to a misaligned mask, it is desirable to avoid oxygen containing recipes to avoid copper oxidation. However, the presence of the barrier layer 209 reduces or prevents the possibility of exposure of the copper due to misalignment.

Figure 2B:
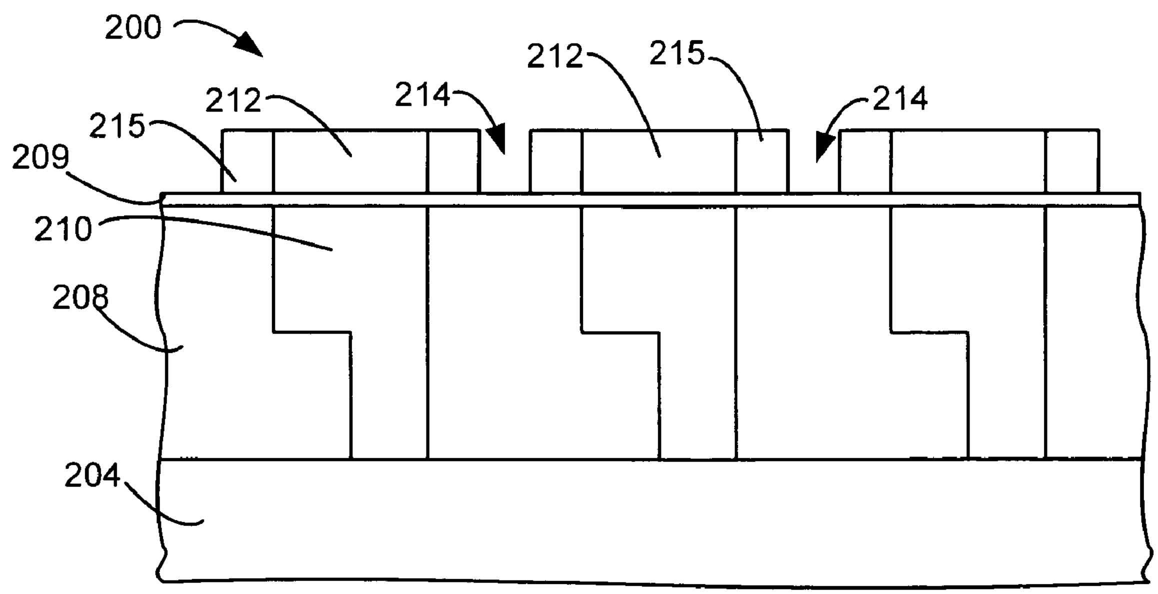

Preferably, the process is performed for between 2 to 20 cycles. More preferably, the process is performed between 3 to 10 cycles. The combination of deposition and profile shaping over a plurality of cycles allows for the formation of vertical sidewalls for the shrink. This process forms shrink sidewalls 215, as shown in FIG. 2B. Preferably, the shrink sidewalls cause widths of the photoresist mask apertures to be reduced by between 5-80%. More preferably, the shrink sidewalls cause the widths of the photoresist mask apertures to be reduced by between 5-50%. The cyclical cycle may have additional deposition and/or shaping phases or may have other additional phases.

Figure 2C:
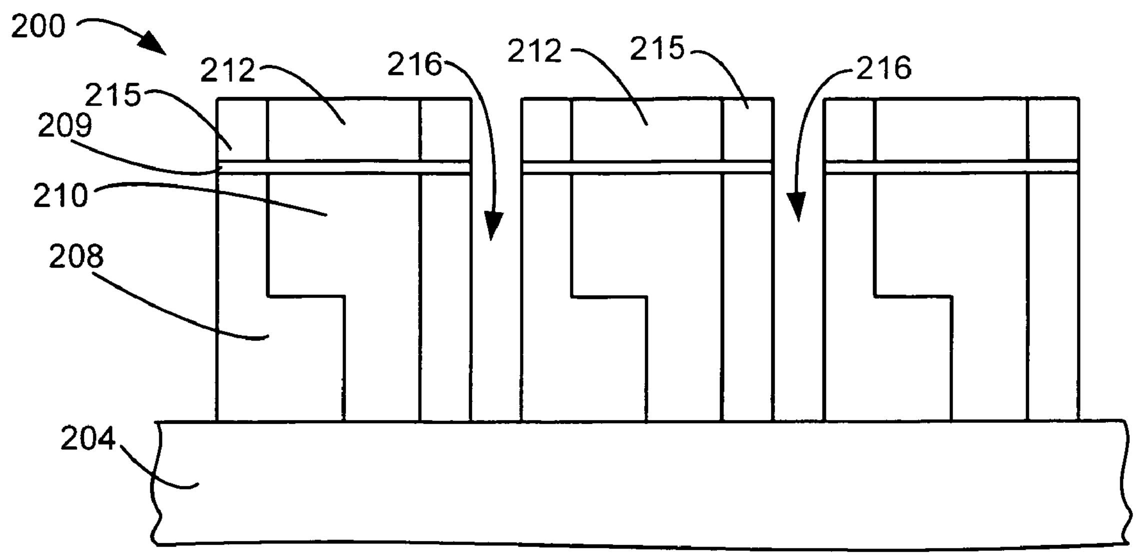

Gaps 216 are etched into the dielectric layer 208 through the apertures between the shrink sidewalls 215, as shown in FIG. 2C. A conventional etch recipe for etching the dielectric layer 208 is used.

Figure 2D:
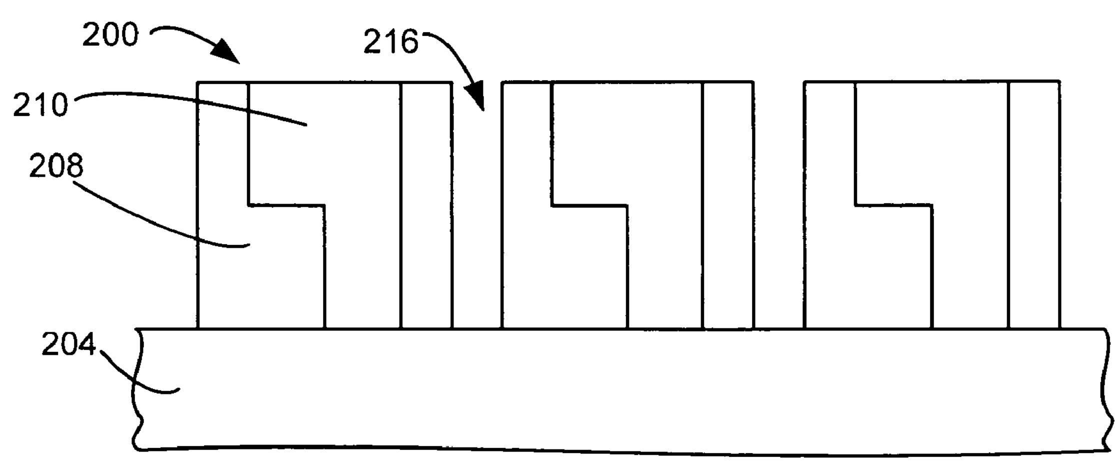
Figure 2E:
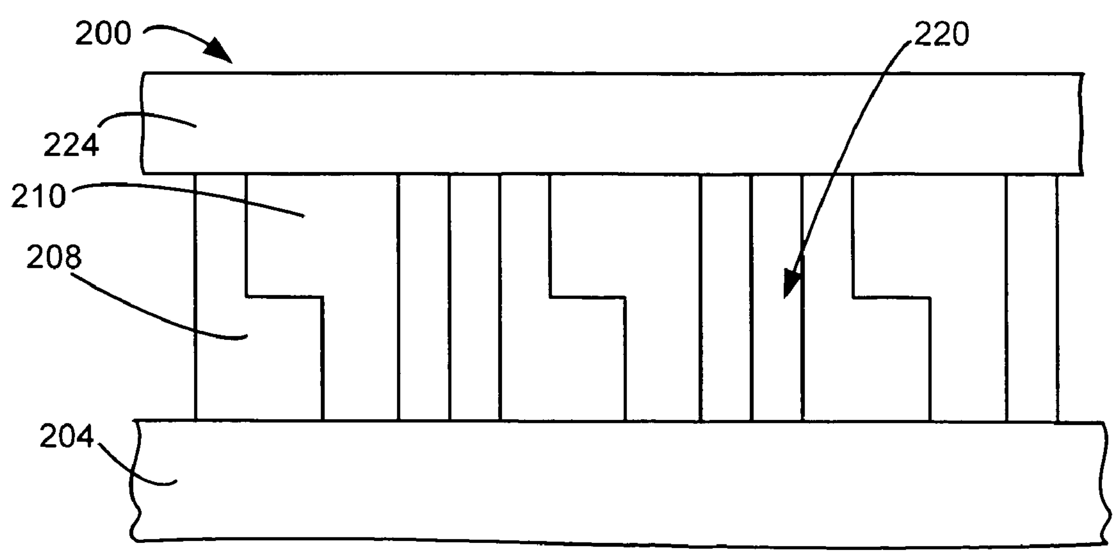
Figure 6:
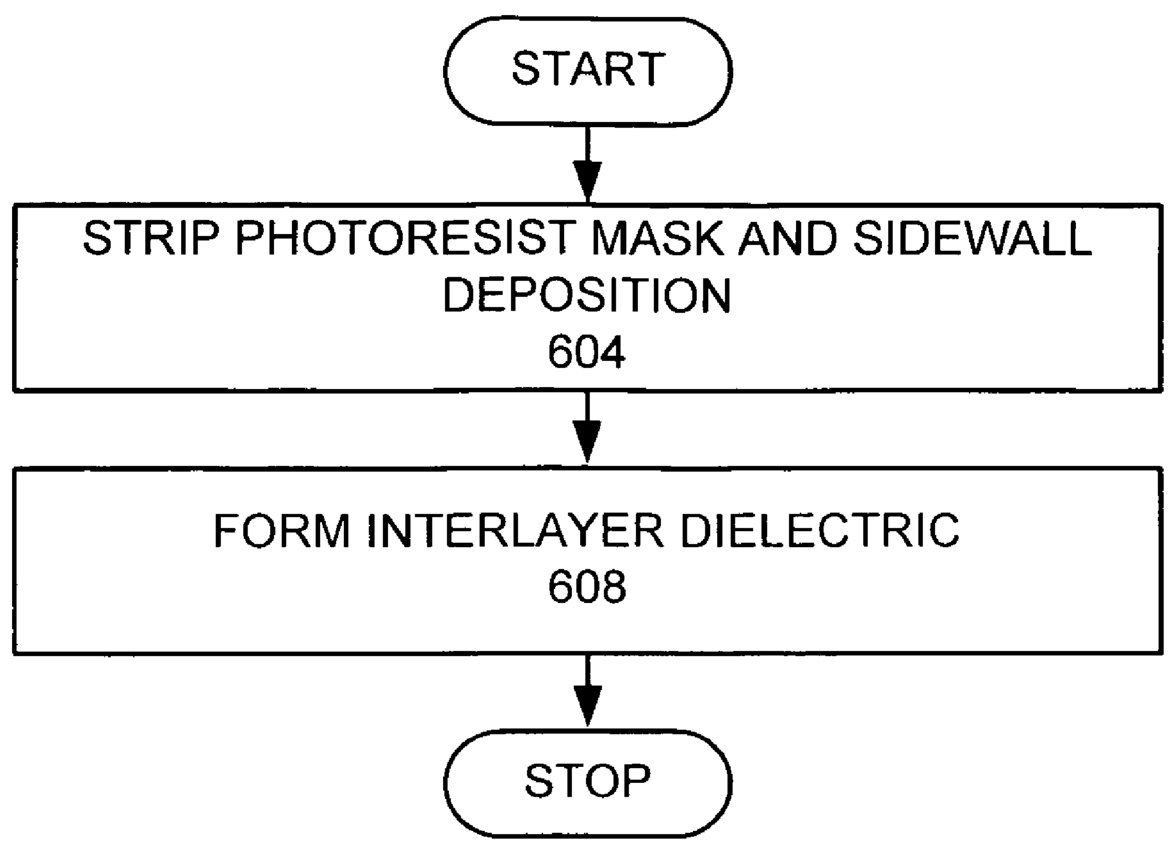
FIG. 6 is a more detailed flow chart of forming pockets and completing the process.

The pockets are then formed (step 120). FIG. 6 is a more detailed flow chart of the formation of the pockets and completion of the structure in this example. The photoresist mask is stripped (step 604), as shown in FIG. 2D. In this example, the sidewall deposition is also removed during the photoresist mask strip. An interlayer dielectric (ILD) 224 is formed over the dielectric layer 208, contacts 210, and gaps (step 608), which seal the gaps to form pockets 220, as shown in FIG. 2E. Conventional methods of forming the ILD, such as spin on or CVD may be used.

The feature shrink process allows the formation of gaps that have critical dimensions that are smaller than critical dimensions of the lithography process used. The photoresist features 214 may use the minimum critical dimension possible for the lithography process used. In this example, the trench width is the minimum critical dimension possible for the lithographic process used. The shrink process allows for a further reduction of the critical dimensions of the feature size. Without the shrink, the etching of the gap may allow the contact structure to be exposed to the etching of the gap, which would damage the contact structure.

In addition, this process allows the dielectric to be one of many different dielectric materials, wherein the process disclosed in U.S. Pat. No. 6,297,125 is limited regarding the dielectric materials that can be used and requires a barrier layer to protect the contact, which may increase the dielectric constant.

EXAMPLE 2

Figure 7A:
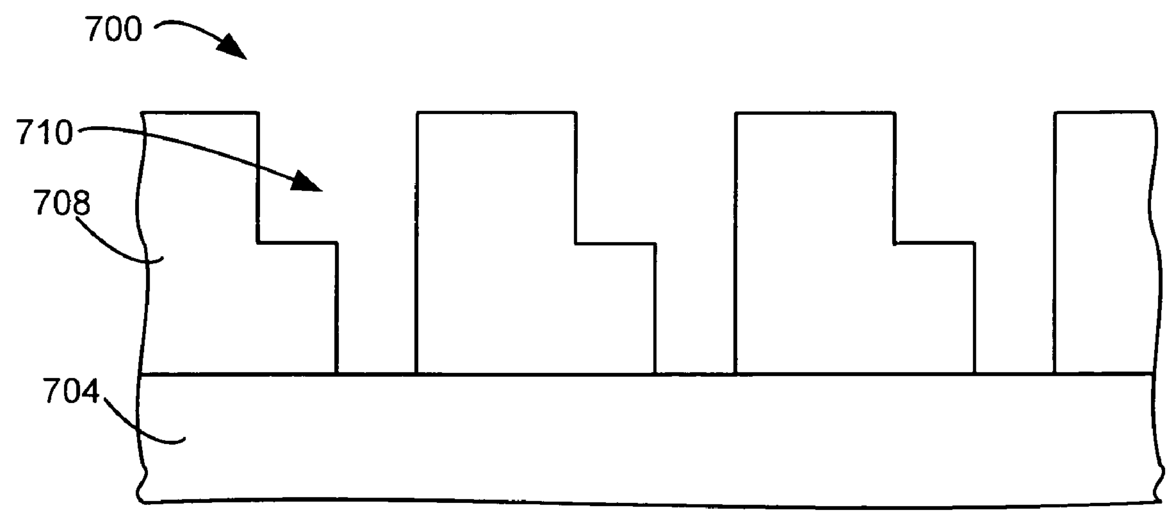
FIGS. 7A-H are schematic cross-sectional and top views of a stack processed according to another embodiment of the invention.
Figure 7B:
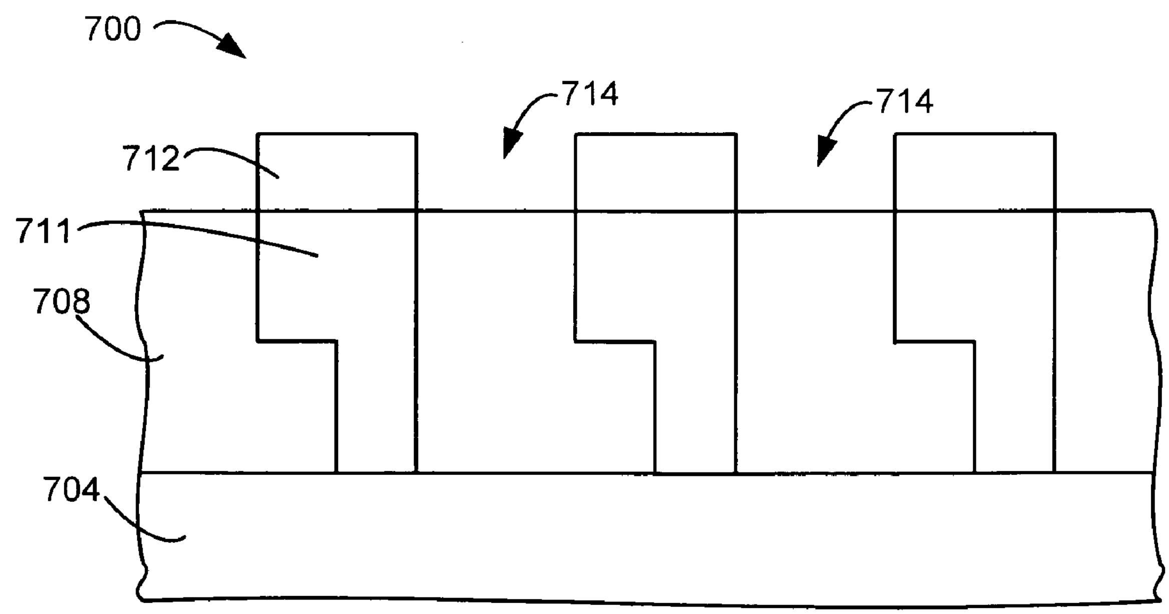

In a second example of an embodiment of the invention, contact structures are formed in a dielectric layer (step 104). FIG. 7A is a cross-sectional view of a stack 700 formed by this example. In this example, the dielectric layer 708 as organosilicate glass (OSG) over a substrate 704, which may be a wafer or an interlayer dielectric. The contact structures 710 are dual damascene structures that have been etched but not filled with a metal contact. The contact structures are filled with a filler material 711, such as photoresist or other polymers or material that may be removed without damaging the dielectric, as shown in FIG. 7B.

Figure 7C:
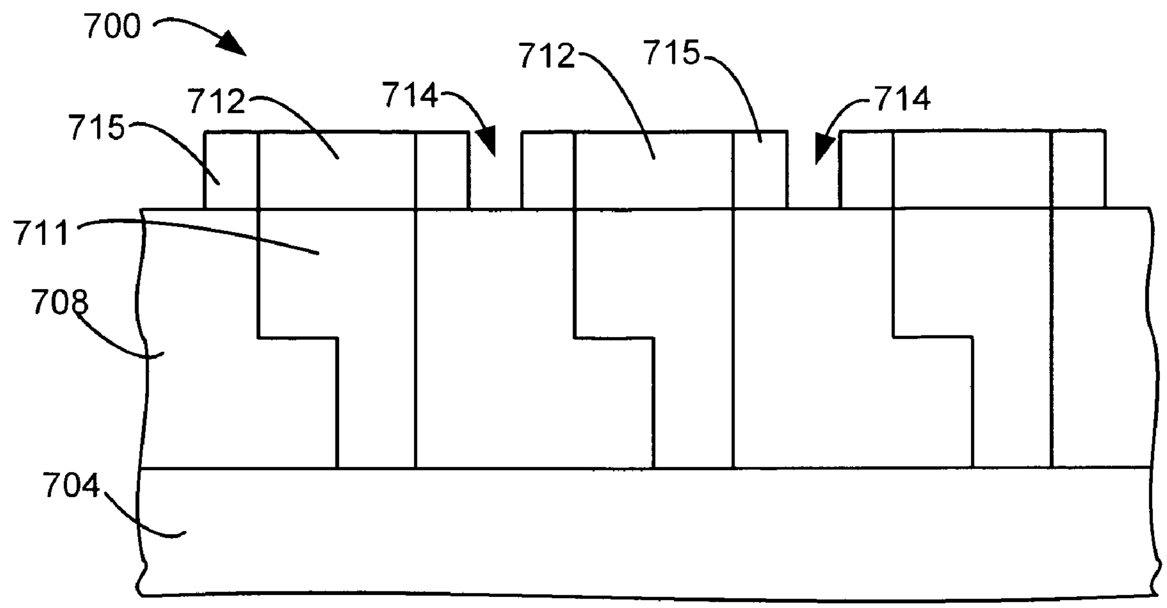

A mask 712 is formed over the filler material 711 in the contact structures (step 108). In this example, the mask 712 is a photoresist mask with photoresist features (apertures) 714. The photoresist mask features 714 are shrunk (step 112), by forming a shrink sidewall 715 on sidewalls of the photoresist mask features, as shown in FIG. 7C. To shrink the photoresist mask features 714, the substrate 704 is placed into a processing chamber, such as the processing chamber 400, as described above. The shrink process described in the above example regarding FIG. 3 may be used.

As shown in FIG. 3, the shrinking of gaps comprises a plurality of cycles of a cyclic process comprising a shrink deposition phase (step 304) and shrink profile shaping phase (step 308). Preferably, the shrink deposition phase (step 304) uses a deposition gas comprising at least one of a combination of $CF_4$ and $H_2$ or a combination of $CH_3F$ and $N_2$ or $C_xF_y$ or $C_xH_yF_z$ with an oxidizing or reducing additive such as hydrogen, nitrogen, or oxygen, and carrier gases such as He, Ar, Ne, Kr, Xe etc. More generally, the deposition gas comprises at least one of hydrocarbon, fluorocarbon, and hydrofluorocarbon. More preferably, the deposition gas further comprises a carrier gas, such as argon or xenon. More preferably, the deposition gas further comprises at least one of an oxidizing additive and a reducing additive, such as $O_2$, $H_2$, or $NH_3$.

The profile shaping stage uses a profile shaping gas, which is different than the deposition gas comprising at least one of $C_xF_y$ and $NF_3$ and $C_xH_yF_z$. More preferably, the profile shaping gas further comprises a carrier gas, such as argon or xenon. More preferably, the profile shaping gas further comprises at least one of an oxidizing additive and a reducing additive, such as $O_2$, $H_2$, or $NH_3$.

An example of a shrink deposition phase (step 304) provides a flow of 150 sccm $CH_3F$, 75 sccm $N_2$, and 100 sccm Ar. The pressure is set to 80 mTorr. The substrate is maintained at a temperature of 20° C. The second RF source 448 provides 400 Watts at a frequency of 27 MHz and 0 Watts a frequency of 2 MHz.

Preferably, the shrink profile shaping stage uses a profile shaping gas comprising at least one of $C_xF_y$ and $NF_3$ and $C_xH_yF_z$. More preferably, the profile shaping gas further comprises a carrier gas, such as argon or xenon. More preferably, the profile shaping gas further comprises at least one of an oxidizing additive and a reducing additive, such as $O_2$, $H_2$, or $NH_3$.

An example of the profile shaping phase (step 308) provides a halogen (i.e. fluorine, bromine, chlorine) containing gas, such as 100 sccm $CF_4$. In this example, $CF_4$ is the only gas provided during the profile shaping. A pressure of 20 mTorr is provided to the chamber. The second RF source 448 provides 600 Watts at a frequency of 27 MHz and 0 Watts a frequency of 2 MHz.

Figure 7D:
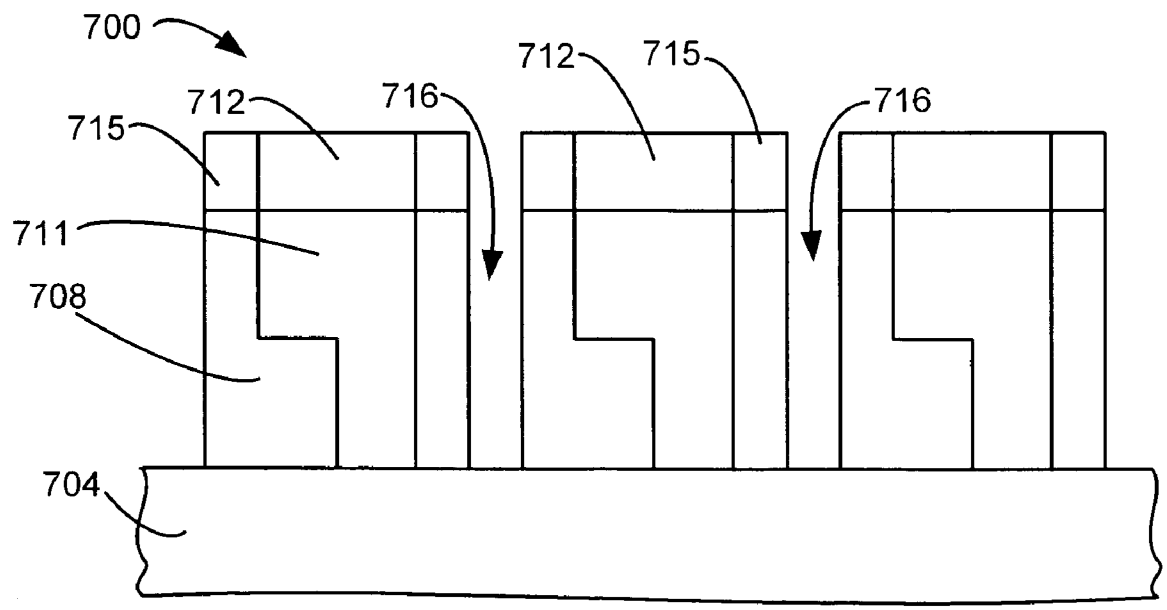

Gaps 716 are etched into the dielectric layer 708 through the apertures between the shrink sidewalls 715, as shown in FIG. 7D. A conventional etch recipe for etching the dielectric layer 208 is used.

Figure 7E:
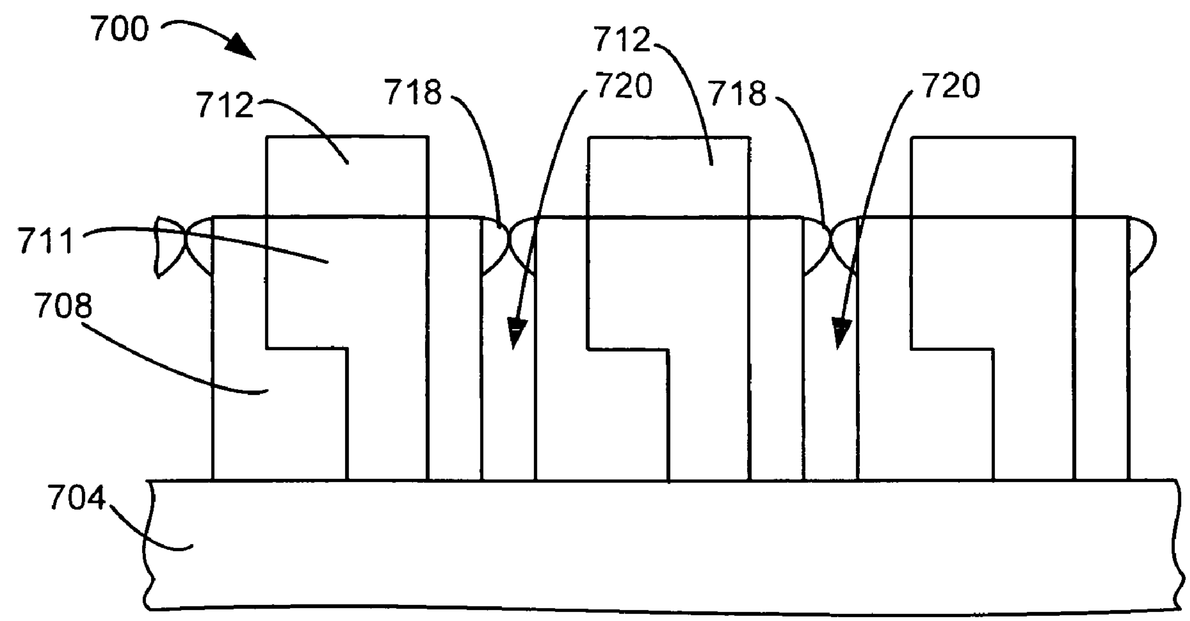
Figure 8:
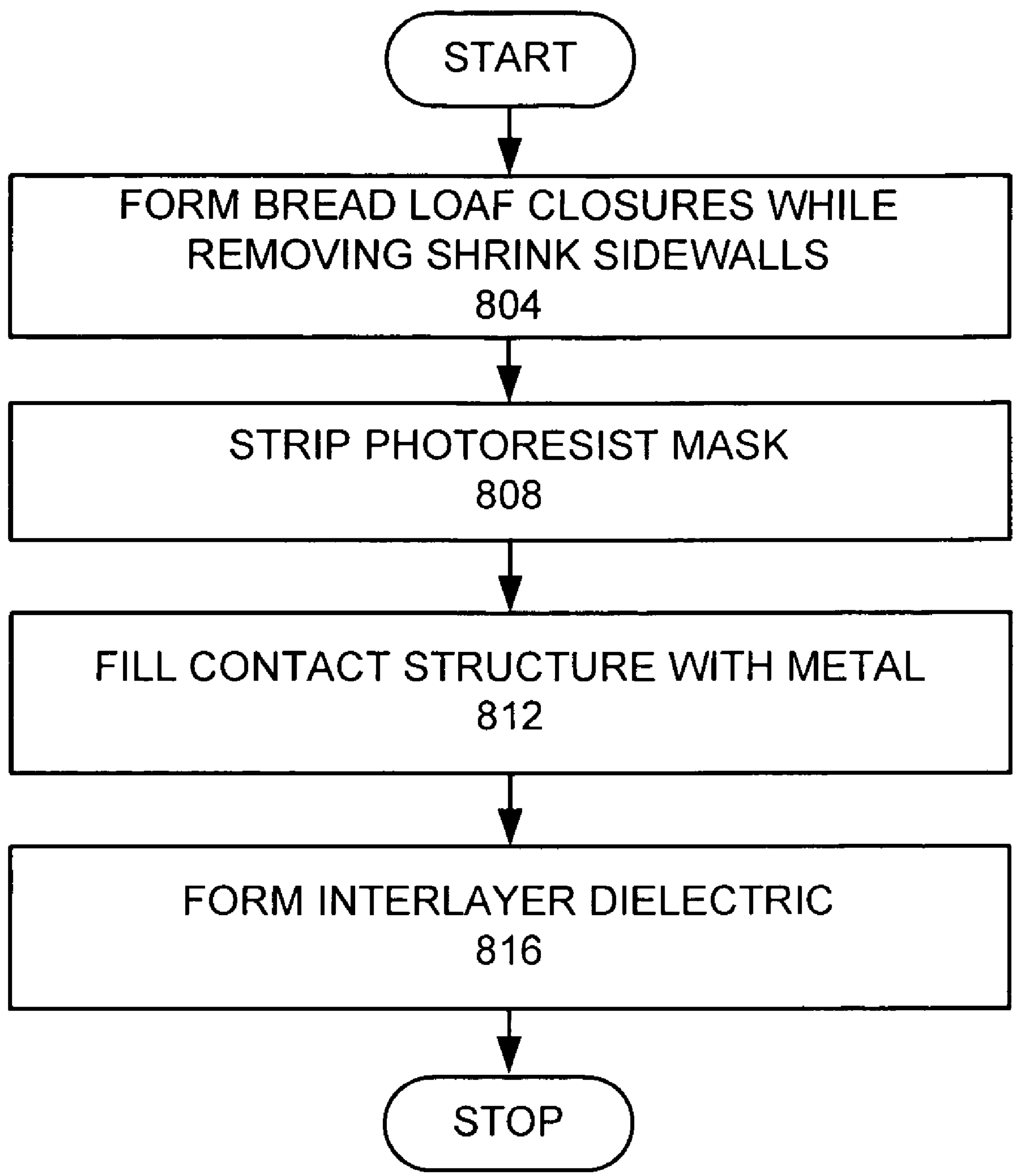
FIG. 8 is a more detailed flow chart of another process of forming pockets and completing the process.
Figure 9:
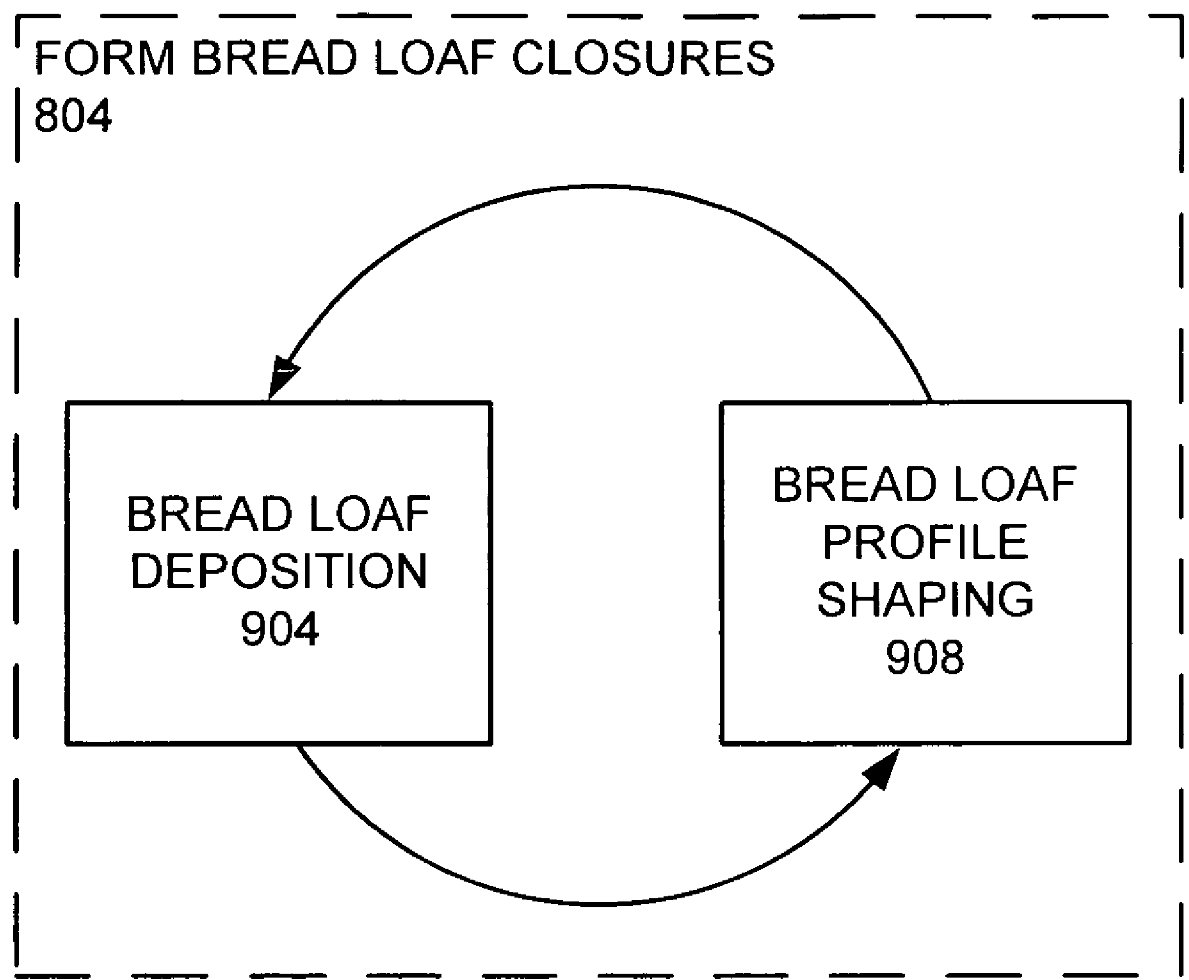
FIG. 9 is a more detailed flow chart of forming bread loaf closures.

Pockets are formed (step 120). FIG. 8 is a more detailed flow chart of the formation of pockets in this example. A bread loaf deposition is used to form closures 718 for the gaps to form closed pockets 720 and remove the shrink sidewalls (step 804), as shown in FIG. 7E. Preferably, each pocket 720 has a volume that is at least half the volume of the gap. The bread loaf closures 718 may be formed using a deposition process or by using a multiple phase cyclical deposition process. FIG. 9 is a more detailed view of a multiphase cyclical process for the step of forming the bread loaf closures while removing the shrink sidewalls (step 804). A bread loaf deposition phase (step 904) is performed. This phase provides a deposition on sidewalls of the gaps. During the deposition phase a deposition gas is provided, a plasma is formed from the deposition gas, and then the deposition gas is stopped. A bread loaf profile shaping phase (step 908) is then provided. This phase shapes the profile of the deposition to form bread loaf closures. During the bread loaf profile shaping phase a bread loaf profile shaping gas, which is different than the deposition gas, is provided, a plasma is formed from the bread loaf profile shaping gas, and then the bread loaf profile shaping gas is stopped. In addition, this phase is used to remove the shrink sidewalls. Preferably, this cycle is repeated from 3 to 20 times. The multiphase and multiple cycle process is able to provide a bread loaf closure in the gap below the top surface of the dielectric layer.

The advantage of forming the bread loaf closures while removing the shrink sidewalls avoids a subsequent shrink sidewall removal, which could damage the bread loaf closures. However, other embodiments may remove the shrink sidewalls separately through a process that does not damage the bread loaf closures, such as using a CMP process.

It is desirable to form the bread loaf closure in the gap, so that the closure is below the top surface of the etch layer. One advantage of this is that a CMP process will not damage such closures. It is believed that a multiphase and/or multiple cycle process is an advantageous process for forming such closures in the gap.

Figure 7F:
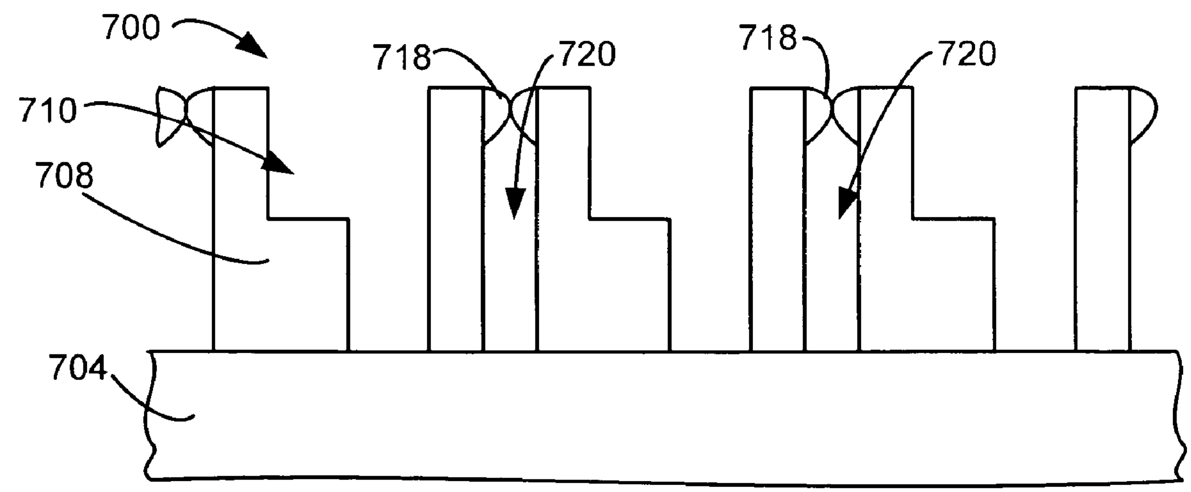
Figure 7G:
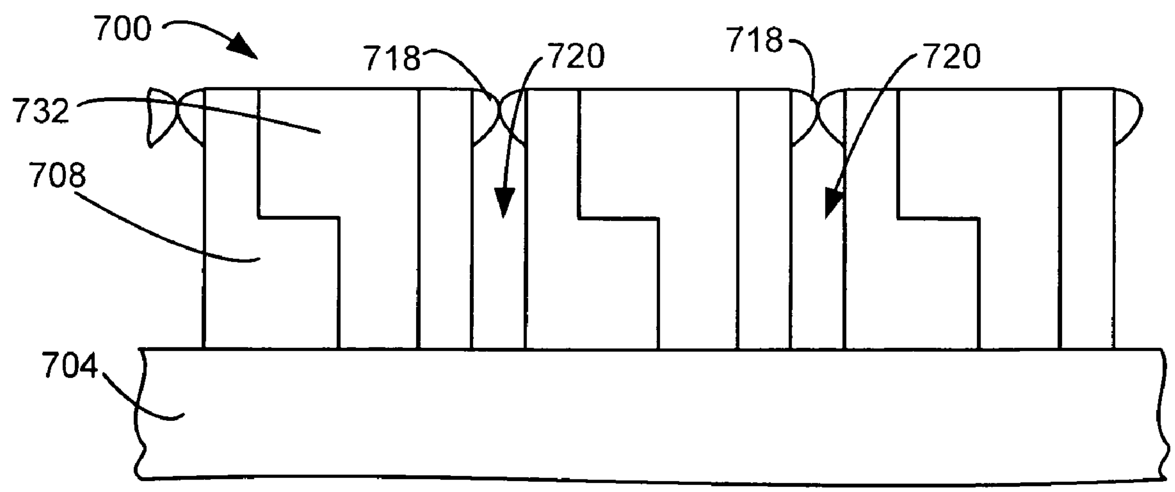

The photoresist mask is then stripped (step 808), as shown in FIG. 7F. In other embodiments, the photoresist mask may be stripped during the formation of the bread loaf closures. In this example, polymer is removed from the contact structures 710 when the photoresist mask is stripped, as shown In FIG. 7F. The contact structures are filled with a metallic material 732 (step 812), such as copper, to form metal contacts, using conventional metal filling processes, as shown in FIG. 7G. The bread loaf closures prevent the metallic material from filling the pockets 720.

Figure 7H:
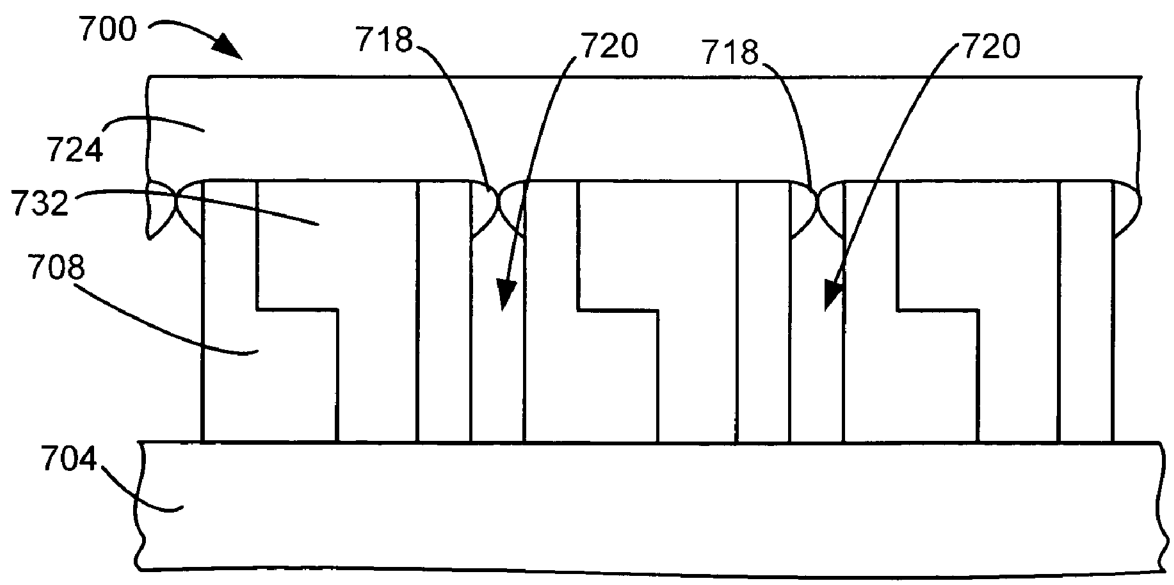

An interlayer dielectric (ILD) 724 is formed over the dielectric layer 708, contacts, and bread loaf closures 718 (step 816), as shown in FIG. 7H. Conventional methods of forming the ILD, such as spin on or CVD may be used.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for reducing capacitances between semiconductor device wirings, comprising:

forming a plurality of contact structures in a dielectric layer;

forming a mask to cover the contact structures wherein the mask has mask features for exposing parts of the dielectric layer wherein the mask features have widths;

shrinking the widths of the mask features with a sidewall deposition;

etching gaps into the dielectric layer through the sidewall deposition; and closing the gaps to form pockets in the gaps.

2. The method, as recited in claim 1, wherein the shrinking the widths of the mask features comprises at least one shrink cycle, wherein each shrink cycle comprises:

a shrink deposition phase, which forms deposits on sidewalls of the mask features to shrink the mask features; and a shrink profile shaping phase, which shapes the deposition on the sidewalls of the mask features.

3. The method, as recited in claim 2, wherein the shrinking the widths of the mask features shrinks the widths of the mask features by 5-80% and wherein the profile shaping phase shapes the deposition on the sidewalls of the mask features to form vertical sidewalls.

4. The method, as recited in claim 3, wherein the shrinking the widths of the mask features comprises 3 to 20 shrink cycles.

5. The method, as recited in claim 4, wherein each gap has a volume and each pocket has a volume, wherein the volume of each pocket is at least half the volume of the gap in which the pocket is located.

6. The method, as recited in claim 5, wherein the shrink deposition phase comprises:

providing a deposition gas;

forming a plasma from the deposition gas; and stopping the flow of the deposition gas.

7. The method, as recited in claim 6, wherein the shrink profile shaping phase comprises:

providing a profile shaping gas;

forming a plasma from the profile shaping gas; and stopping the flow of the profile shaping gas.

8. The method, as recited in claim 7, wherein the deposition gas comprises at least one of a hydrocarbon, fluorocarbon, and hydrofluorocarbon and the profile shaping gas comprises at least one of $C_xF_y$, $NF_3$, and $C_xH_yF_z$.

9. The method, as recited in claim 8, wherein the closing the gaps comprises a plurality of cycles, wherein each cycle comprises:

a bread loaf deposition phase; and a bread loaf profile shaping phase.

10. The method, as recited in claim 2, wherein the shrink deposition phase comprises:

providing a deposition gas;

forming a plasma from the deposition gas; and stopping the flow of the deposition gas.

11. The method, as recited in claim 10, wherein the shrink profile shaping phase comprises:

providing a profile shaping gas;

forming a plasma from the profile shaping gas; and stopping the flow of the profile shaping gas.

12. The method, as recited in claim 11, wherein the deposition gas comprises at least one of a hydrocarbon, fluorocarbon, and hydrofluorocarbon and the profile shaping gas comprises at least one of $C_xF_y$, $NF_3$, and $C_xH_yF_z$.

13. The method, as recited in claim 1, wherein the closing the gaps comprises a plurality of cycles, wherein each cycle comprises:

a bread loaf deposition phase; and a bread loaf profile shaping phase.

14. The method, as recited in claim 1, wherein the forming the contact structures, comprises:

etching features in the dielectric layer; and placing a conductive material in the etched features in the dielectric layer.

15. The method, as recited in claim 14, further comprising forming a barrier layer over the contact structures and dielectric layer before forming the mask to cover the contact structures.

16. The method, as recited in claim 1, wherein the forming the contact structures, comprises etching features in the dielectric layer and wherein the forming the mask to cover the contact structures fills that contact structures with photoresist.

17. The method, as recited in claim 1, wherein the contact structures each comprise at least one via and at least one trench.

18. A method for reducing capacitances between semiconductor devices, comprising:

forming a plurality of contact structures in a dielectric layer;

forming a mask to cover the contact structures wherein the mask has mask features for exposing parts of the dielectric layer wherein the mask features have widths;

shrinking the widths of the mask features with a sidewall deposition, wherein the shrinking the widths of the mask features shrinks the widths of the mask features by 5-80%, wherein the shrinking the widths of the mask features comprises at least one shrink cycle, wherein each shrink cycle comprises:

a shrink deposition phase, which forms deposits on sidewalls of the mask features to shrink the mask features; and a shrink profile shaping phase, which shapes the deposition on the sidewalls of the mask features, wherein the profile shaping phase shapes the deposition on the sidewalls of the mask features to form vertical sidewalls;

etching gaps into the dielectric layer through the sidewall deposition; and closing the gaps to form pockets in the gaps, wherein the closing the gaps comprises a plurality of cycles, wherein each cycle comprises:

a bread loaf deposition phase; and a bread loaf profile shaping phase.

19. The method, as recited in claim 18, wherein the shrinking the widths of the mask features comprises 3 to 20 shrink cycles.

20. The method, as recited in claim 18, wherein the contact structures each comprise at least one via and at least one trench.

* * * * *